United States Patent [19]

Carothers et al.

[11] 4,359,520

[45] Nov. 16, 1982

[54] ENHANCEMENT OF RESIST DEVELOPMENT

[75] Inventors: James A. Carothers; James Economy; Augustus C. Ouano, all of San Jose, Calif.

[73] Assignee: International Business Machines Corporation, Armonk, N.Y.

[21] Appl. No.: 36,461

[22] Filed: May 7, 1979

Related U.S. Application Data

[63] Continuation of Ser. No. 854,440, Nov. 23, 1977, abandoned.

[51] Int. Cl.³ .............................................. G03C 5/00
[52] U.S. Cl. .................................... 430/326; 430/296
[58] Field of Search .............. 96/36, 49, 75; 430/326, 430/323, 141, 296, 193

[56] References Cited

U.S. PATENT DOCUMENTS

| | | | |
|---|---|---|---|
| 3,046,119 | 7/1962 | Süs | 430/193 |
| 3,902,906 | 9/1975 | Iwama et al. | 430/326 |
| 3,950,173 | 4/1976 | Ross et al. | 430/193 |
| 3,961,100 | 6/1976 | Harris et al. | 430/296 |
| 3,961,101 | 6/1976 | Barton | 430/296 |
| 4,007,047 | 2/1977 | Kaplan et al. | 430/324 |

*Primary Examiner*—Won H. Louie, Jr.
*Attorney, Agent, or Firm*—Joseph G. Walsh

[57] ABSTRACT

The present invention is concerned with enhancement of resist development. In particular it is concerned with obtaining high solubility rate ratio between the exposed and the unexposed regions of a resist and also obtaining shorter development time. These objectives are achieved by treating the resist with a liquid trialkylamine having from two to eight carbon atoms in each alkyl group.

5 Claims, No Drawings

ENHANCEMENT OF RESIST DEVELOPMENT

This is a continuation, of application Ser. No. 854,440 filed Nov. 23, 1977, now abandoned.

BACKGROUND OF THE INVENTION

The present invention is concerned with resists useful as photoresists and as electron beam resists. In particular, it is concerned with resists having quinonediazo or quinonetriazo materials as the photoactive component and phenolaldehyde type resins as the host or binder material. Resists of this sort are well-known in the art and are discussed, for example, in U.S. Pat. Nos. 3,046,119 and 3,950,173. By treating such a resist with a liquid trialkylamine containing from two to eight carbon atoms in each alkyl group, improvements in the solubility rate ratio and in the development time are obtained.

PRIOR ART

Various methods of increasing solubility rate ratio or shortening development time have been used in the prior art. U.S. Pat. No. 3,961,100 describes a process in which the resist film is contacted with developer solution and water prior to exposure.

U.S. Pat. No. 3,961,101 describes a two-stage development process in which a water wash is employed between stages.

U.S. Pat. No. 4,007,047 describes the treatment of a positive photoresist layer with hydrogen ion following initial exposure.

SUMMARY OF THE INVENTION

The present invention is concerned with a process for achieving very high solubility rate ratio between the exposed and the unexposed regions of a resist system at a minimum dosage of irradiation. The process also results in a shorter development time so that the throughput of the lithographic process can be increased. The resists used in the present process are quinone-diazo or quinone-triazo sensitized phenolic-aldehyde resins. In accordance with the present invention, the resists are contacted with a trialkylamine containing from two to eight carbon atoms in each alkyl group.

The expression "differential solubility rate" refers to the ratio between the rate at which the exposed region of the resist is dissolved (known as S) and the rate at which the unexposed region is dissolved (known as $S_0$). It is desired to increase this ratio to the maximum, and increasing this ratio is one of the objects of the present invention.

In carrying out the process of the present invention, the resist can be contacted with the amine either before or after the resist has been exposed to radiation. It is, however, preferred that the contacting take place after the irradiation, because in cases where it takes place before the exposure, traces of residual amine may remain and be an undesired contaminant during the irradiation step.

The optimum time of contact between the amine and the resist will vary with the depth of etch profile desired. In general, a contact time of from about one minute to about 30 minutes is best. It is advantageous to use very high purity amine. The process should preferably be carried out under anhydrous conditions.

The following examples are given solely for purposes of illustration and are not to be considered limitations on the invention, many variations of which are possible without departing from the spirit or scope thereof.

PROCEDURE FOR TRIALKYLAMINE TREATMENT

Photo or electron beam resist material of the type described above is coated on a substrate, i.e., 1 to 3 μm thick resist on silicon wafers by spin coating technique. The coated wafers are then baked at ca. 85° C. to 95° C. for thirty minutes. After baking, the wafers are exposed to light through a mask, which defines the patterns desired, or to an electron beam. The exposed wafers are subsequently immersed in a bath of the trialkylamine for the desired length of time (1 to 30 minutes) depending on the thickness of the resist, the trialkylamine used and the desired profile of the developed pattern. After soaking the exposed resist, it is spun dried for ca. one minute and immediately developed in an appropriate developer which is either aqueous potassium hydroxide solution of approximately 0.25 normal concentration or a highly buffered sodium hydroxide sodium silicate water solution for a desired length of time which depends on the image profile desired, the type trialkylamine used and the intensity of exposure.

The results are shown below in Table I. For controls, experiments are shown with no treatment, with ammonia treatment, and with trimethylamine treatment. As can be seen from the table, treatment with ammonia is actually harmful, and treatment with trimethylamine produces very little result. On the other hand, treatment with the amines of the present invention yields very beneficial results.

TABLE I

| Treatment | $S_0$ A/Min | S A/Min | $S/S_0$ | $T_E$ (Secs.) | $T_U$ (Secs.) |
|---|---|---|---|---|---|
| None | 660 | 3,460 | 5.6 | 0 | 150 |
| $NH_3$ | 8,400 | 16,000 | 1.9 | 0 | 0 |
| $(CH_3)_3N$ | 600 | 5,100 | 8.5 | 0 | 150 |
| $(CH_3CH_2)_3N$ | 470 | 4,900 | 10.4 | 0 | 200 |
| $(CH_3CH_2CH_2)_3N$ | 210 | 3,300 | 15.7 | 60 | 350 |
| $(CH_3CH_2CH_2Ch_2)_3N$ | 0 | 923 | ∞* | 300 | 800 |

*With tributylamine the image was fully developed without dissolution taking place in the unexposed regions of the resist. The $T_U$ was longer than the development time.

We claim:

1. A process for increasing the solubility rate ratio of a quinone-diazo or quinone-triazo sensitized phenolic-aldehyde resist, said process comprising contacting the resist under anhydrous conditions either before or after the resist has been subjected to imagewise exposure to radiation with an anhydrous trialkylamine which is in the liquid state and which contains from two to eight carbon atoms in each alkyl group, and then contacting said resist with an aqueous alkaline developer to dissolve the exposed regions.

2. A process as claimed in claim 1, wherein the amine is tributylamine.

3. A process as claimed in claim 1, wherein the amine is tripropylamine.

4. A process as claimed in claim 1, wherein the contacting between the amine of the resist is continued for about one to about 30 minutes.

5. A process as claimed in claim 1 wherein the contacting is done after exposure of the resist to radiation.

* * * * *